(12) United States Patent
Mahony et al.

(10) Patent No.: US 7,080,264 B2
(45) Date of Patent: Jul. 18, 2006

(54) METHODS AND APPARATUS FOR PROVIDING MICROPROCESSOR FIRMWARE CONTROL OF POWER SEQUENCING ON A CPCI CARD

(75) Inventors: Maire Mahony, Sunnyvale, CA (US); Gerald Pelissier, Round Rock, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 502 days.

(21) Appl. No.: 10/317,538

(22) Filed: Dec. 11, 2002

(65) Prior Publication Data

US 2004/0117681 A1 Jun. 17, 2004

(51) Int. Cl.
*G06F 1/26* (2006.01)

(52) U.S. Cl. ............... 713/300; 713/320; 713/330
(58) Field of Classification Search ........... 713/300, 713/320, 324, 330; 710/301, 302, 104, 100; 361/727, 752, 687
See application file for complete search history.

(56) References Cited

U.S. PATENT DOCUMENTS

| | | | |
|---|---|---|---|
| 4,994,685 A * | 2/1991 | Mathison | 307/66 |
| 5,331,285 A * | 7/1994 | Marshall et al. | 324/713 |
| 5,737,524 A | 4/1998 | Cohen et al. | |
| 6,003,100 A | 12/1999 | Lee | |
| 6,237,103 B1 * | 5/2001 | Lam et al. | 713/330 |
| 6,501,660 B1 * | 12/2002 | Ho et al. | 361/752 |
| 6,813,150 B1 * | 11/2004 | King et al. | 361/687 |
| 6,853,551 B1 * | 2/2005 | Baar et al. | 361/687 |
| 6,968,414 B1 * | 11/2005 | Abbondanzio et al. | 710/301 |
| 2003/0140190 A1 | 7/2003 | Mahony et al. | |

FOREIGN PATENT DOCUMENTS

GB 2380839 4/2003

OTHER PUBLICATIONS

Sensor Business Digest, ADI Advances Tilt/Motion Sensing and System Hardware Monitoring, Oct. 1, 2000, Vital Information Publications, pp. 9.*

(Continued)

*Primary Examiner*—Thomas Lee
*Assistant Examiner*—Suresh K Suryawanshi
(74) *Attorney, Agent, or Firm*—Meyertons Hood Kivlin Kowert & Goetzel, P.C.; B. Noël Kivlin (57) ABSTRACT

A Compact Peripheral Component Interconnect (CPCI) system includes a circuit board with a front card (e.g., motherboard) coupled to a power supply via the circuit board. The CPCI system is adapted to provide for the dynamic control and change of power sequences during the front card's lifetime. That is, as power sequencing requirements evolve, change or deviate from what was the standard, the present extended front card can automatically evolve, change or deviate from what was the standard. The front card may also control and change power sequences without requiring modification to be made to the hardware of the front card.

27 Claims, 9 Drawing Sheets

OTHER PUBLICATIONS

Joshua Israelsohn, Hardware-monitor IC polices microprocessor systems, Oct. 26, 2000, EDN, pp. 2.*

Microelectronics, Hot Swap Controller, Oct. 26, 2000, Microelectronics, Inc., pp. 28.*

Intel, Intel Server System SSH4 Board Set Technical Product Specification, Oct. 2002, Intel, pp. 51-52.*

Intel, Intel Server System SDS2 Technical Product Specification, Dec. 2, 2002, Intel, pp. 27-29.*

Joshua Israelsohn, Hardware-monitor IC polices uP systems, Oct. 26, 2000, EDN, p. 1.*

PCI Industrial Computers PICMG 2.0 R2.1 CompactPCI Specification Short Form Compact PCI Short Form Specification, Revision 2.1, Sep. 2, 1997; 1995, 1996, 1997; pp. 1-7.

Integrated Circuits; Unitrode 9-Line 3-5-Volt SCSI Active Terminator, Reverse Disconnect Circuit Design Patented; UCC5606; 1999, Texas Instruments Incorporated; pp. 1-5.

International search report application number GB0327064.2 mailed Apr. 19, 2004.

* cited by examiner

| PIN | Z | A | B | C | D | E | F | Section |
|---|---|---|---|---|---|---|---|---|
| 1 | GND | 5v | -12v | TRST# | +12v | 5v | GND | 404a |
| 2-3 | GND | YYY | YYY | YYY | YYY | YYY | GND | 404a |
| 4 | GND | BRSVP1B5 | BD_HEALTHY# | V(I/O) | INTP | INTS | GND | 404a |
| 5 | GND | BRSVP1A5 | BRSVP1B5 | BD_RESET# | GND | GNT# | GND | 404a |
| 6-14 | GND | YYY | YYY | YYY | YYY | YYY | GND | 404a |
| 15 | GND | 3.3v | FRAME# | IRDY# | BD_SELECT# | TRDY# | GND | 404a |
| 16-22 | GND | YYY | YYY | YYY | YYY | YYY | GND | 404a |
| 1 | GND | GA4 | GA3 | GA2 | GA1 | GA0 | GND | 404b |
| 2 | GND | CLK6 | GND | RSV | RSV | RSV | GND | 404b |
| 3-20 | GND | YYY | YYY | YYY | YYY | YYY | GND | 404b |
| 21 | GND | CLK2 | CLK3 | SYSEN# | GNT2# | REQ3# | GND | 404b |
| 22 | GND | CLK1 | GND | REQ1# | GNT1# | REQ2# | GND | 404b |
| 1 | GND | XXX | XXX | XXX | XXX | XXX | GND | 404c |
| 2 | GND | XXX | XXX | XXX | XXX | XXX | GND | 404c |
| 3-19 | GND | XXX | XXX | XXX | XXX | XXX | GND | 404c |
| 1 | GND | XXX | XXX | XXX | XXX | XXX | GND | 404d |
| 2 | GND | YYY | YYY | YYY | YYY | YYY | GND | 404d |
| 3-20 | GND | XXX | XXX | XXX | XXX | XXX | GND | 404d |
| 21 | GND | YYY | YYY | YYY | YYY | YYY | GND | 404d |
| 22 | GND | XXX | XXX | XXX | XXX | XXX | GND | 404d |
| 1 | GND | XXX | XXX | XXX | XXX | XXX | GND | 404e |
| 2 | GND | XXX | XXX | XXX | XXX | XXX | GND | 404e |
| 3-20 | GND | YYY | YYY | YYY | YYY | YYY | GND | 404e |
| 21 | GND | XXX | XXX | XXX | XXX | XXX | GND | 404e |
| 22 | GND | XXX | XXX | XXX | XXX | XXX | GND | 404e |

| PIN | F | E | D | C | B | A | Z |
|---|---|---|---|---|---|---|---|
| 22 | GND | XXX | XXX | XXX | XXX | XXX | GND |
| 21 | GND | XXX | XXX | XXX | XXX | XXX | GND |
| 3-20 | GND | YYY | YYY | YYY | YYY | YYY | GND |
| 2 | GND | XXX | XXX | XXX | XXX | XXX | GND |
| 1 | GND | XXX | XXX | XXX | XXX | XXX | GND |
| 22 | GND | XXX | XXX | XXX | XXX | XXX | GND |
| 21 | GND | YYY | YYY | YYY | YYY | YYY | GND |
| 3-20 | GND | XXX | XXX | XXX | XXX | XXX | GND |
| 2 | GND | XXX | XXX | XXX | XXX | XXX | GND |
| 1 | GND | YYY | YYY | YYY | YYY | YYY | GND |
| 3-19 | GND | XXX | XXX | XXX | XXX | XXX | GND |
| 2 | GND | XXX | XXX | XXX | XXX | XXX | GND |
| 1 | GND | XXX | XXX | XXX | XXX | XXX | GND |
| 22 | GND | GA0 | GA1 | GA2 | GA3 | GA4 | GND |
| 21 | GND | RSV | RSV | RSV | GND | CLK6 | GND |

METHODS AND APPARATUS FOR PROVIDING MICROPROCESSOR FIRMWARE CONTROL OF POWER SEQUENCING ON A CPCI CARD

BACKGROUND OF THE INVENTION

1. Field of the Invention

The present invention relates to a Peripheral Component Interconnect (PCI) system. More particularly, the present invention relates to methods and apparatus that are adapted for controlling power distribution of a front card connected with a PCI backplane.

2. Description of Related Art

Compact Peripheral Component Interconnect (CPCI) is a high performance industrial bus based on the standard PCI electrical specification in rugged 3U or 6U Eurocard packaging. CPCI is intended for application in telecommunications, computer telephony, real-time machine control, industrial automation, real-time data acquisition, instrumentation, military systems or any other application requiring high speed computing, modular and robust packaging design, and long term manufacturer support. Because of its high speed and bandwidth, the CPCI bus is particularly well suited for many high-speed data communication applications such as servers, routers, and switches.

Compared to a standard desktop PCI, CPCI supports twice as many PCI slots (typically 8 versus 4) and offers an ideal packaging scheme for industrial applications. Conventional CPCI cards are designed for front loading and removal from a card cage. The cards are firmly held in position by their connector, card guides on both sides, and a faceplate that solidly screws into the card cage. Cards are mounted vertically allowing for natural or forced air convection for cooling. Also, the pin-and-socket connector of the CPCI card is significantly more reliable and has better shock and vibration characteristics than the card edge connector of the standard PCI cards.

Conventional CPCI defines a CPCI backplane that is typically limited to eight slots. More specifically, the bus segment of the conventional CPCI system is limited to eight slots in which front cards (e.g., motherboards) and mating transition cards are installed. Typically, the front card provides substantially all features and functions (i.e., clocking, arbitration, configuration, and interrupt processing) of the CPCI system and the transition card allows access to these features and functions by providing ports, such as Small Computer System Interface (SCSI) ports.

In general, as technology of the CPCI products evolve and change, a front card may feature a number of voltage rails (e.g., +12V, −12V, 3.3V, 5V, 1.8V) that require strictly controlled sequencing upon insertion or extraction of the front card from the CPCI system. For example, a central processing unit (CPU) for a front card may require that its core voltage (e.g., the 1.8V used to power the logics within the CPU) be made available before Input/Output (I/O) voltage (e.g., the 3.3V used to power the input/output interfaces of the CPU). Specifically, problems arise when the power sequence requirements change or deviate from what the standard(s) provide.

Accordingly, it would be desirable to provide a CPCI system that is adapted to provide for methods and apparatus that can change power sequences during a front card's lifetime in a cost effective manner (e.g., without having to modify the front card's hardware which can become quite costly).

SUMMARY OF THE INVENTION

The present invention relates to a CPCI system that is adapted to provide for a low-cost and highly flexible system that can control and change power sequences during a front card's (e.g., a motherboard's) lifetime that overcomes the limitations of the prior art. The system allows the front card to change power sequences to a main processor on the front card without having to modify the front card's hardware.

In an embodiment of the invention, a Compact Peripheral Component Interconnect (CPCI) system includes a circuit board, a power supply, and a front card. The front card is coupled to the power supply via the circuit board. The power supply provides a plurality of powers having a plurality of voltages to a main processor on the front card. A hardware unit is located on the front card. The hardware unit comprises a digital-to-analog converter (DAC) output, a pulse-width-modulated (PWM) output, and an analog-to-digital (ADC) input. A microprocessor is coupled with the hardware unit. The microprocessor controls an monitors the hardware. The microprocessor also runs a firmware. The firmware, through the hardware, enables the microprocessor to dynamically control and monitor a power-sequencing operation of the main processor.

In another embodiment of the invention, a method is developed for implementing power sequencing on a CPCI front card. The method includes steps as follows. A power supply is coupled to a main processor on the front card through a circuit board. The front card is provided with a hardware unit for providing a digital-to-analog converter (DAC) output, a pulse-width-modulated (PWM) output, and an analog-to-digital converter (ADC) input. A firmware running on the microprocessor controls the DAC output and the PWM output and monitors a digital voltage signal derived from the ADC input. The firmware also determines a sequence regarding how first and second voltage are to be provide from the power supply to the main processor. The firmware then, through the DAC output and the PWM output, controls the sequence on how the first voltage and the second voltage are provided to the main processor.

A more complete understanding of the present invention will be afforded to those skilled in the art, as well as a realization of additional advantages and objects thereof, by a consideration of the following detailed description of the embodiment. Reference will be made to the appended sheets of drawings, which first will be described briefly.

BRIEF DESCRIPTION OF THE DRAWINGS

The drawings illustrate the design and utility of preferred embodiments of the invention. The components in the drawings are not necessarily to scale, emphasis instead being placed upon illustrating the principles underlying the embodiment. Moreover, in the drawings like reference numerals designate corresponding parts throughout the different views.

DETAILED DESCRIPTION

The present invention is directed to a method and system that is adapted to provide for a low-cost and highly flexible system that can control and change power sequences during a front card's (e.g., a motherboard's) lifetime that overcomes the limitations of the prior art.

Embodiments of the present invention are applicable to a front card comprising a plurality of hardware Integrated Circuits (ICs) that support simple power control and power sequencing of various voltage rails based on a market standard when the front card is inserted to and extracted from a CPCI system. Specifically, a CPCI front card may feature a number of voltage rails (e.g. +12V, −12V, 3.3V, 5V, 1.8V) that require strictly controlled power sequencing upon insertion or extraction of the front card from the CPCI system. For example, a central processing unit (CPU) on the front card may require that core voltage (e.g., 1.8V) is available before Input/Output (I/O) voltage (e.g., 3.3V). In one embodiment, an extension to the hardware ICs is provided that can dynamically control power sequencing on the front card. That is, as power sequencing requirements evolve, change or deviate from what was the standard, the present extended front card can automatically evolve, change or deviate from what was the standard. In another embodiment, the extension allows the front card to control and change power sequences without requiring modification to be made to the hardware of the front card.

Embodiments of the present invention address the problem outlined above by providing for firmware control of power sequencing. By combining firmware control with readily available hardware components on the front card, a low-cost and highly flexible means of control power sequencing of the front card upon insertion or extraction can be implemented. In one embodiment, the front card has an ability to change power sequences during the lifetime of the front card without having to respin or modify any of its hardware.

Embodiments of the present invention can also be implemented with computing systems that support High Availability (HA). In one embodiment, an HA computing system comprises a front card (e.g., the motherboard) that has two processors, a main processor and a secondary processor. The main processor is usually responsible for general card (i.e., motherboard) functions and is usually the high performance processor of the card (or board). The secondary (e.g., the smaller and lower performance) processor services and monitors the main processor. In another embodiment, the smaller embedded service processor is configured to run firmware only (i.e., it can not run software), this firmware is extended to control the hotswap and power sequencing functions described herein.

Figure 1:
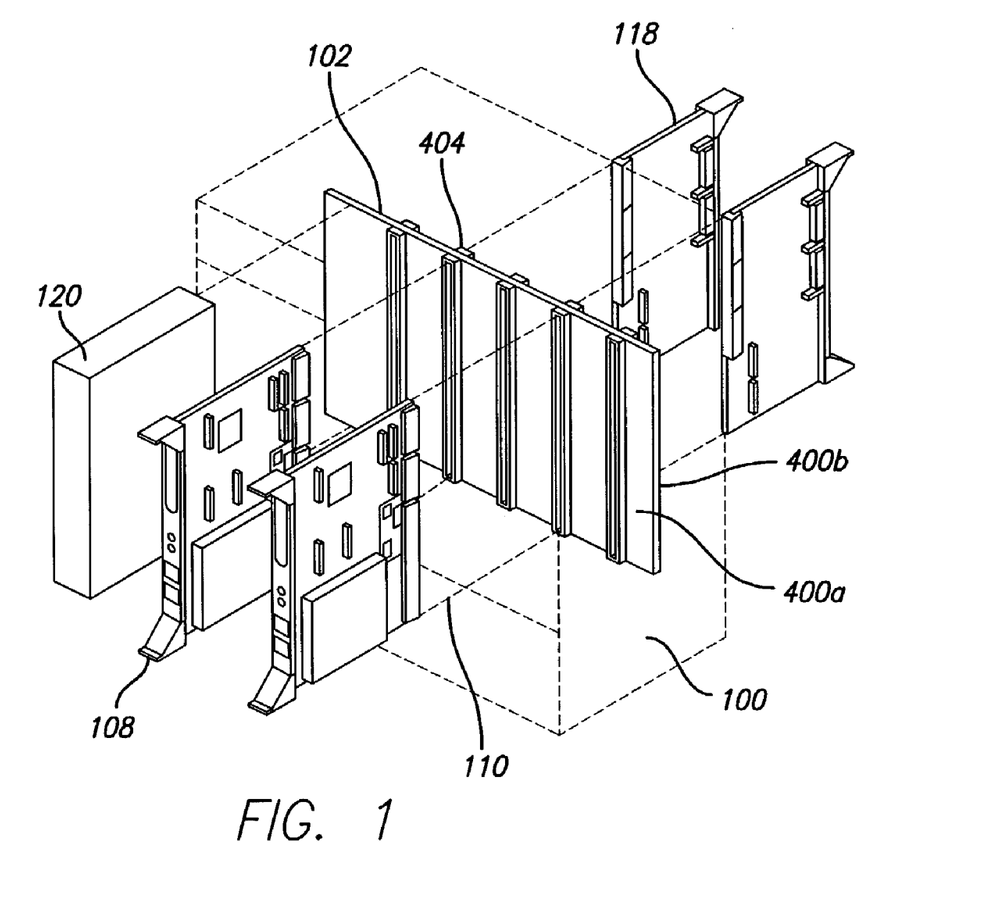
FIG. 1 is an exploded perspective view of a CPCI chassis system according to an embodiment of the invention.

Referring to FIG. 1, there is shown an exploded perspective view of a CPCI chassis system as envisioned in an embodiment of the present invention. The chassis system 100 includes a CPCI circuit board referred to in the conventional CPCI system as a passive backplane (or centerplane) 102 since the circuit board is located at the back of the chassis 100 and front cards (e.g., motherboards) are inserted from the front of the chassis 100. The front side 400a of the backplane 102 has slots provided with connectors 404. A corresponding transition card 118 is coupled to the front card 108 via backplane 102. The backplane 102 contains corresponding slots and connectors (not shown) on its backside 400b to mate with transition card 118. In the chassis system 100 that is shown, a front card 108 may be inserted into appropriate slots and mated with the connectors 404. For proper insertion of the front card 108 into the slot, card guides 110 are provided. This CPCI chassis system 100 provides front removable front cards (e.g., motherboards) and unobstructed cooling across the entire set of front cards. The backplane 102 is also connected to a power supply 120 that outputs power with various voltages (e.g., +12V, −12V, 3.3V, 5V). As a result, the power for the processor or processors on the front cards can be supplied to the front cards via the backplane 102 and the front cards can be provided with a number of voltages (e.g., +12V, −12V, 3.3V, 5V). In one embodiment, a 1.8V may be further generated on the CPCI front card from one of the other voltages (e.g., +12V, −12V, 3.3V, 5V) from the power supply 120.

Figure 2:
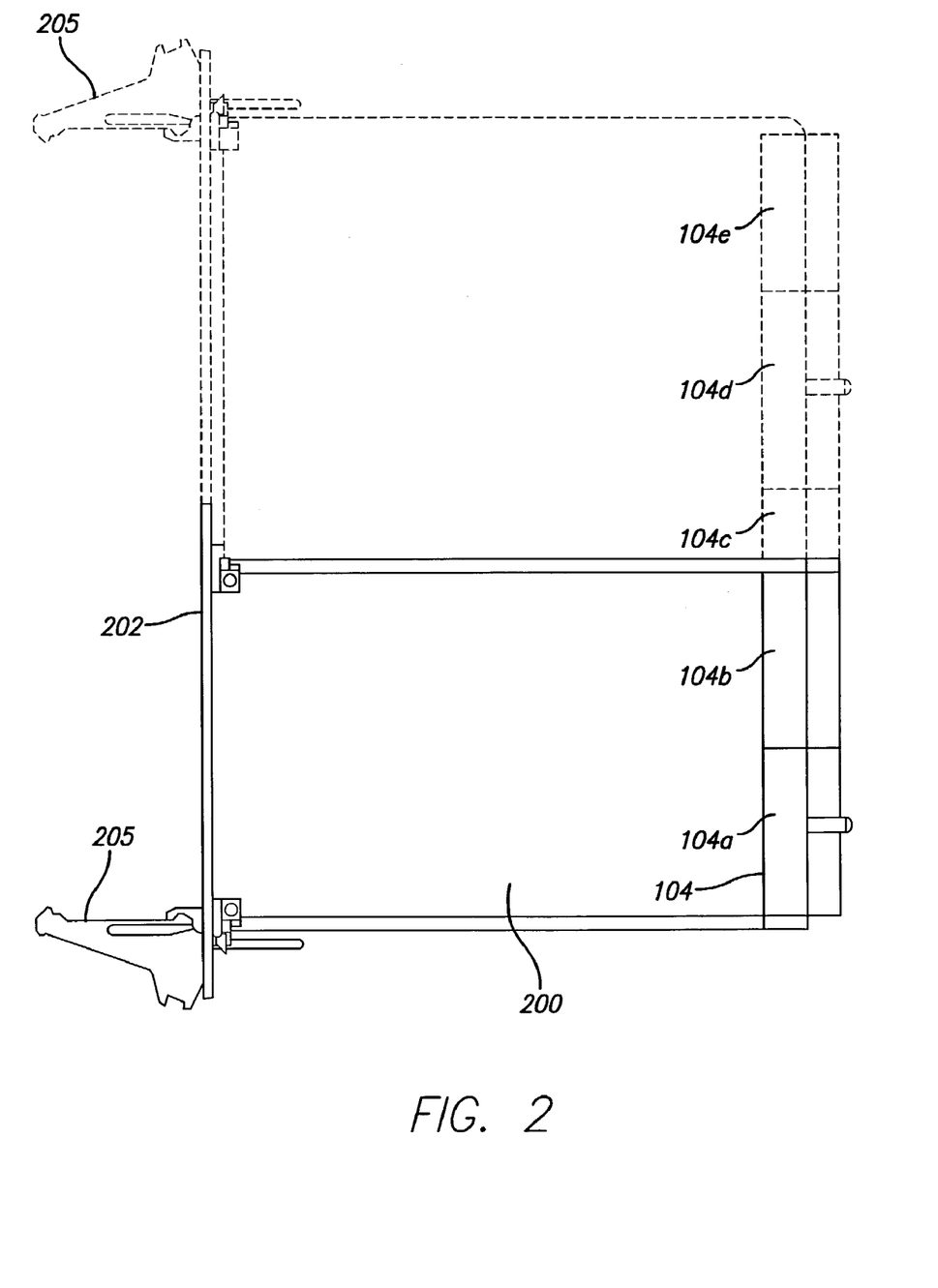
FIG. 2 shows the form factors that are defined for the CPCI front card.

Referring to FIG. 2, there are shown the form factors defined for the CPCI front card (e.g., motherboard), which is based on the PICMG CPCI industry standard (e.g., the standard in the PICMG 2.0 CPCI specification). As shown in FIG. 2, the front card 200 has a front plate interface 202 and ejector/injector handles 205. The front plate interface 202 is consistent with PICMG CPCI packaging and is compliant with IEEE 1101.1 or IEEE 1101.10. The ejector/injector handles should also be compliant with IEEE 1101.1. Two ejector/injector handles 205 are used for the 6U front cards in the present invention. The connectors 104a–104e of the front card 200 are numbered starting from the bottom connector 104a, and the 6U front card size is defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b and is the minimum as it accommodates the full 64 bit CPCI bus. Specifically, the 104a connectors are reserved to carry the signals required to support the 32-bit PCI bus; hence no other signals may be carried in any of the pins of this connector. Optionally, the 104a connectors may have a reserved key area that can be provided with a connector "key," which may be a pluggable piece (e.g., a pluggable plastic piece) that comes in different shapes and sizes, to restrict the add-on card to mate with an appropriately keyed slot. The 104b connectors are defined to facilitate 64-bit transfers or for rear panel I/O in the 3U from factor. The 104c–104e connedtor are available for 6U systems as also shown in FIG. 2. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (i.e., Signal Computing System Architecture (SCSA) or MultiVendor Integration Protocol (MVIP) telephony buses), bridges to other buses (i.e., Virtual Machine Environment (VME) or Small Computer System Interface (SCSI)), or for user specific applications. Note that the CPCI specification defines the locations for all of the connectors 104a–104e, but only the signal-pin assignments for certain connectors are defined (e.g., the CPCI bus portion 104a and 104b are defined). The remaining connectors are the subjects of additional specification efforts or can be user defined for specific applications, as described above.

Figure 3:
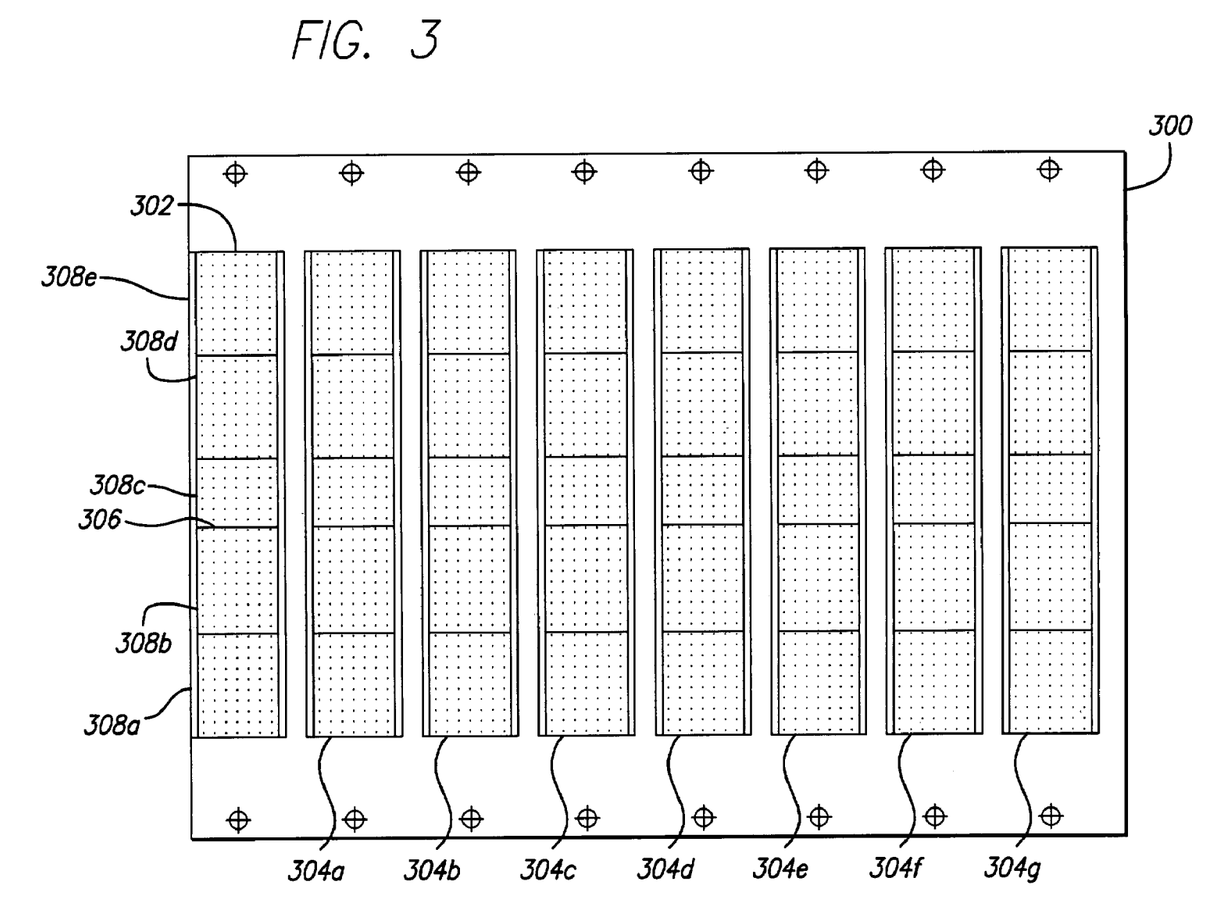
FIG. 3 is a front view of a backplane having eight slots with five connectors each.

Referring to FIG. 3, there is shown a front view of a 6U backplane having eight slots. A CPCI system includes one or more CPCI bus segments, where each bus segment typically includes up to eight CPCI card slots. Each CPCI bus segment includes at least one system slot 302 and up to seven peripheral slots 304a–304g. The CPCI front card for the system slot 302 provides arbitration, clock distribution, and reset functions for the CPCI peripheral cards on the bus segment. The peripheral slots 304a–304g may contain simple cards, intelligent slaves and/or PCI bus masters.

The connectors 308a–308e have connector-pins 306 that project in a direction perpendicular to the backplane 300, and are designed to mate with the front side "active" cards ("front cards"), and "pass-through" its relevant interconnect signals to mate with the rear side "passive" input/output (I/O) card(s) ("rear transition cards"). In other words, in the conventional CPCI system, the connector-pins 306 allow the interconnected signals to pass-through from the front cards, such as the motherboards, to the rear transition cards.

Figure 4A:
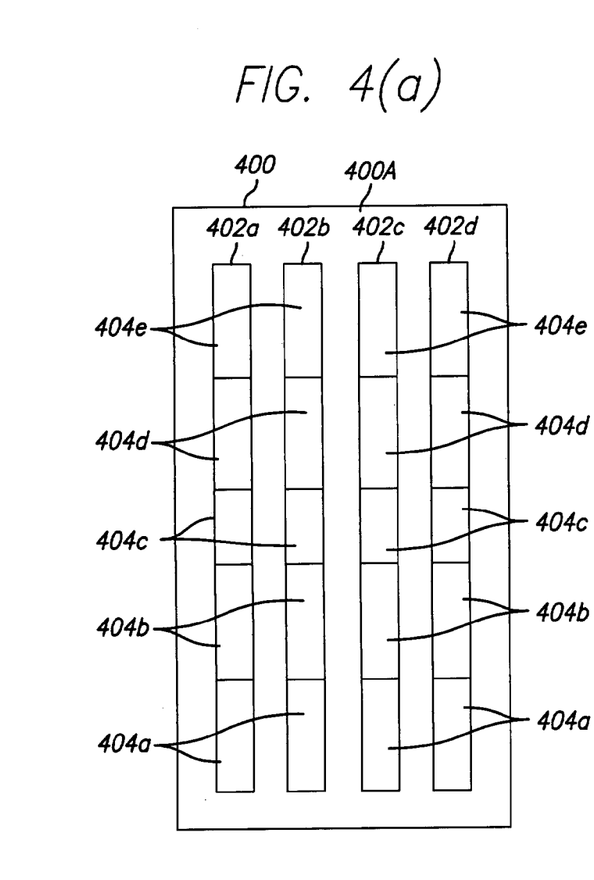
FIG. 4(a) shows a front view of another CPCI backplane.
Figure 4B:
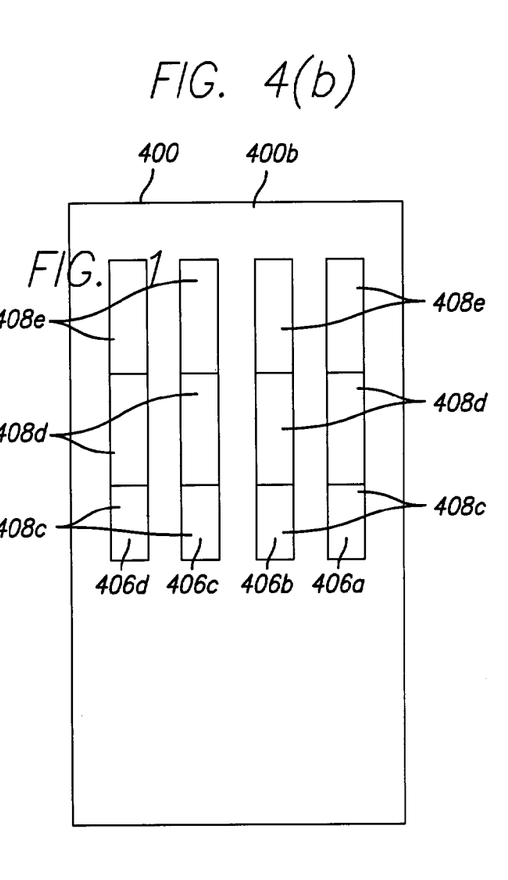
FIG. 4(b) shows a back view of the backplane of FIG. 4(a)

Referring to FIGS. 4(a) and 4(b), there are shown respectively a front and back view of a CPCI backplane in another 6U form factor embodiment. In FIG. 4(a), four slots 402a–402g are provided on the front side 400a of the backplane 400. In FIG. 4(b), four slots 406a–406g are provided on the back side 400b of the backplane 400. Note that in both FIGS. 4(a) and 4(b) four slots are shown instead of eight slots as in FIG. 3. Further, it is important to note that each of the slots 402a–402d on the front side 400a has five connectors 404a–404e while each of the slots 406a–406d on the back side 400b has three connectors 408c–408e. This is because the 404a connectors are provided for 32 bit PCI and connector keying and the 404b connectors are typically only for I/O in the 3U form factor. Thus, in the 6U form factor they do not typically have I/O connectors to their rear. Accordingly, the front cards that are inserted in the front side slots 402a–402d only transmit signals to the rear transition cards that are inserted in the back side slots 406a–406d through front side connectors 404c–404e.

Figure 5:
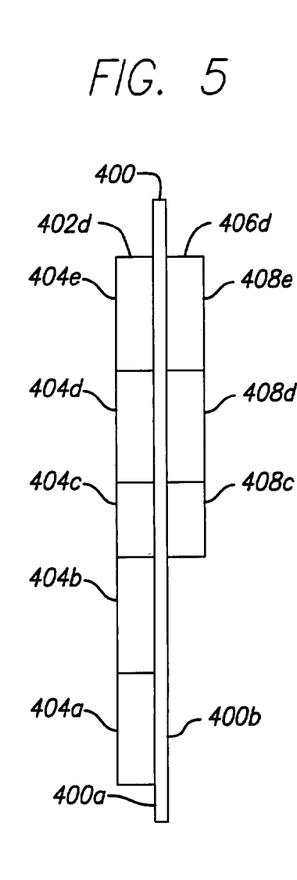
FIG. 5 shows a side view of the backplane of FIGS. 4(a) and 4(b)

Referring to FIG. 5, there is shown a side view of the backplane of FIGS. 4(a) and 4(b). As shown in FIG. 5, slot 402d on the front side 400a and slot 406d on the back side 400b are arranged to be substantially aligned so as to be back to back. Further, slot 402c on the front side 400a and slot 406c on the backside 400b are arranged to be substantially aligned, and so on. Accordingly, the front side connectors 404c–404e are arranged back-to-back with the back side connectors 408c–408e. Note that the front side connector 404a–404b does not have a corresponding back side connector. It is important to note that the system slot 402a is adapted to receive the front card having a CPU; the signals from the system slot 402a are then transmitted to corresponding connector-pins of the peripheral slots 402b–402d. Thus, the preferred CPCI system can have expanded I/O functionality by adding peripheral front cards in the peripheral slots 402b–402d.

Figure 6A:
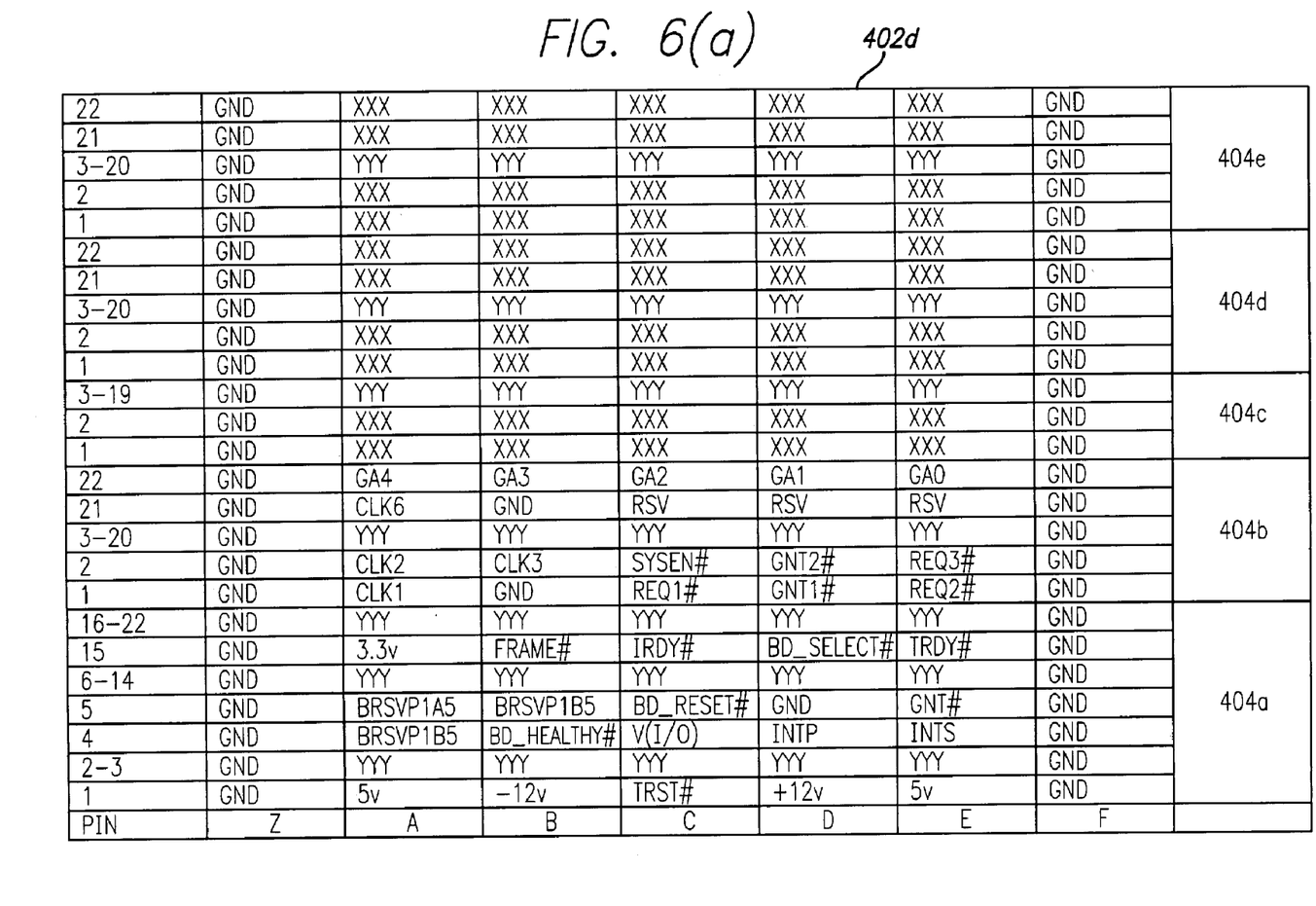
FIG. 6(a) shows a front view of a pin out arrangement of the connectors of a slot.
Figure 6B:
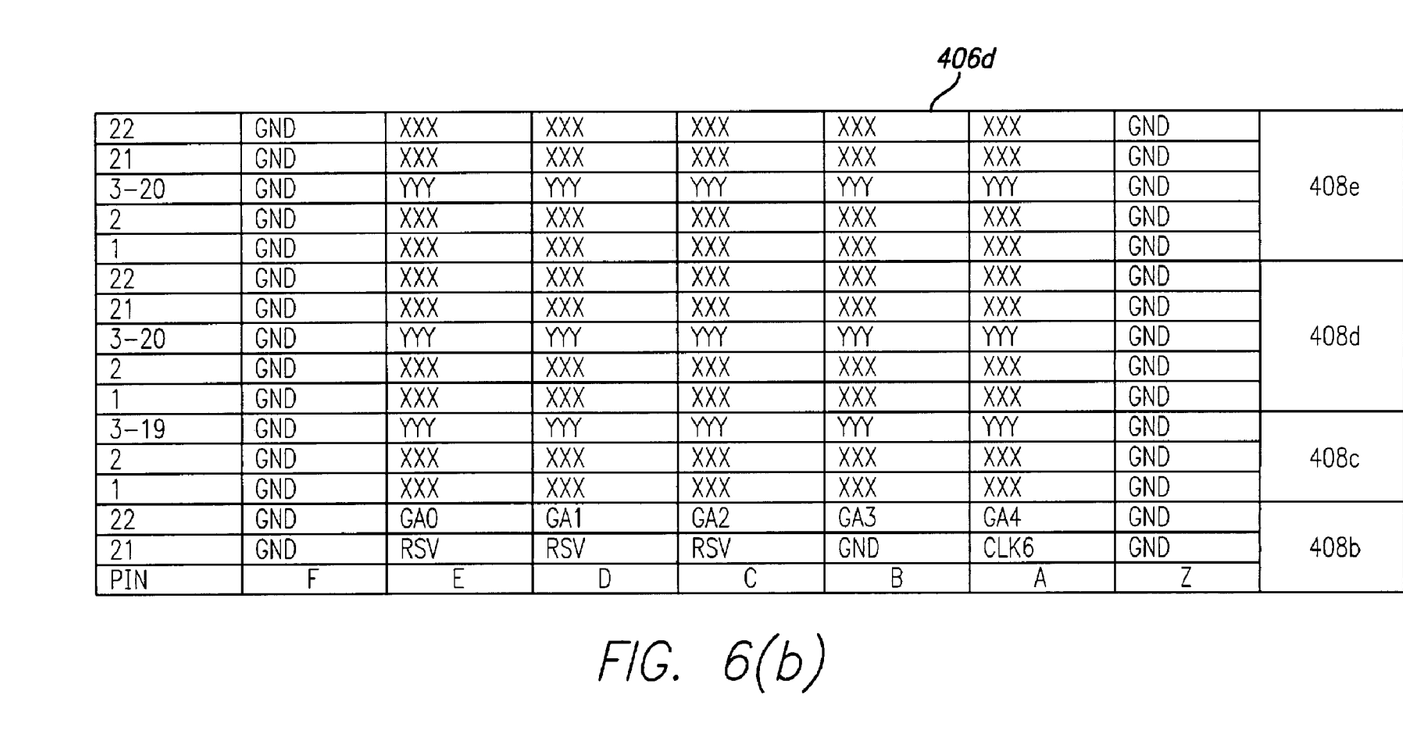
FIG. 6(b) shows a back view of the pin out arrangement of the connectors of the slot of FIG. 6(a)

FIGS. 6(a) and 6(b) illustrate a pin out arrangement of the connectors in a CPCI system. Specifically, FIG. 6(a) shows a front view of a conventional pin out arrangement of the connectors of a slot. Referring to FIG. 6(a), there are shown connectors 404a–404e of slot 402d. The connector-pins are arranged in a column and row configuration. Each of the connectors 404a–404e has seven columns of pins, which are designated as Z, A, B, C, D, E, and F going from left to right. Each of the connectors 404a–b and 404d–e also has twenty-two rows of connector-pins. Connector 404c has nineteen rows of connector-pins.

As shown in FIG. 6(a), all of the connector-pins in the Z and F columns are connected to a ground layer GND in the backplane. The connector-pins of the other columns A, B, C, D, and E are connected to various other signals including ground. Note that in FIG. 6(a), the connector-pins having XXX or YYY designations do not mean that those pins share the same signals, respectively. Instead, the XXX or YYY designations are provided to show that these connector-pins are defined to carry various signals, including CPCI signals, that are not particularly relevant to the present invention, and thus are not specifically shown in FIG. 6(a). Note that only connectors 404a–404c carry CPCI signals. Note also that the other slots 402a–402c have a similar pin out arrangement as shown in slot 402d of FIG. 6(a).

FIG. 6(b) shows a back view of a pin out arrangement of the connectors of a slot. Referring to FIG. 6(b), there are shown connectors 408c–408e of slot 406d. Note that the back view shows three connectors instead of five. This is because, as shown in FIGS. 4(a) and 4(b), the front side of the backplane has five connectors while the back side of the backplane has three connectors. Further, the column arrangement of the connector-pins is designated as F, E, D, C, B, A, and Z going from left to right. This is because the connector-pins of slots 402d and 406d are straight-pass through pins, and so the column designations are mirror images with respect to each other. For example, the connector-pin located at column A, row 2 of connector 404c is the same connector-pin located at column A, row 2 of connector 408c. Also, similar to FIG. 6(a), connector-pins located at columns F and Z in FIG. 6(b) are connected to a ground layer GND in the backplane. Likewise, connector-pins of columns A, B, C, D, and E are connected to various signals, as shown in FIG. 6(a).

More specifically, the Hot Swap/HA specification defines the connector-pin located at column D, row 15 of connector 404(a) to be a BD_SELECT# pin. Other relevant connector-pins of connector 404a include a BD_HEALTHY# pin, which is located at column B, row 4, and a BD_RESET# pin, which is located at column C, row 5. The significance of these connector-pins in the Hot Swap/HA specification is discussed in more detail below.

Figure 7:
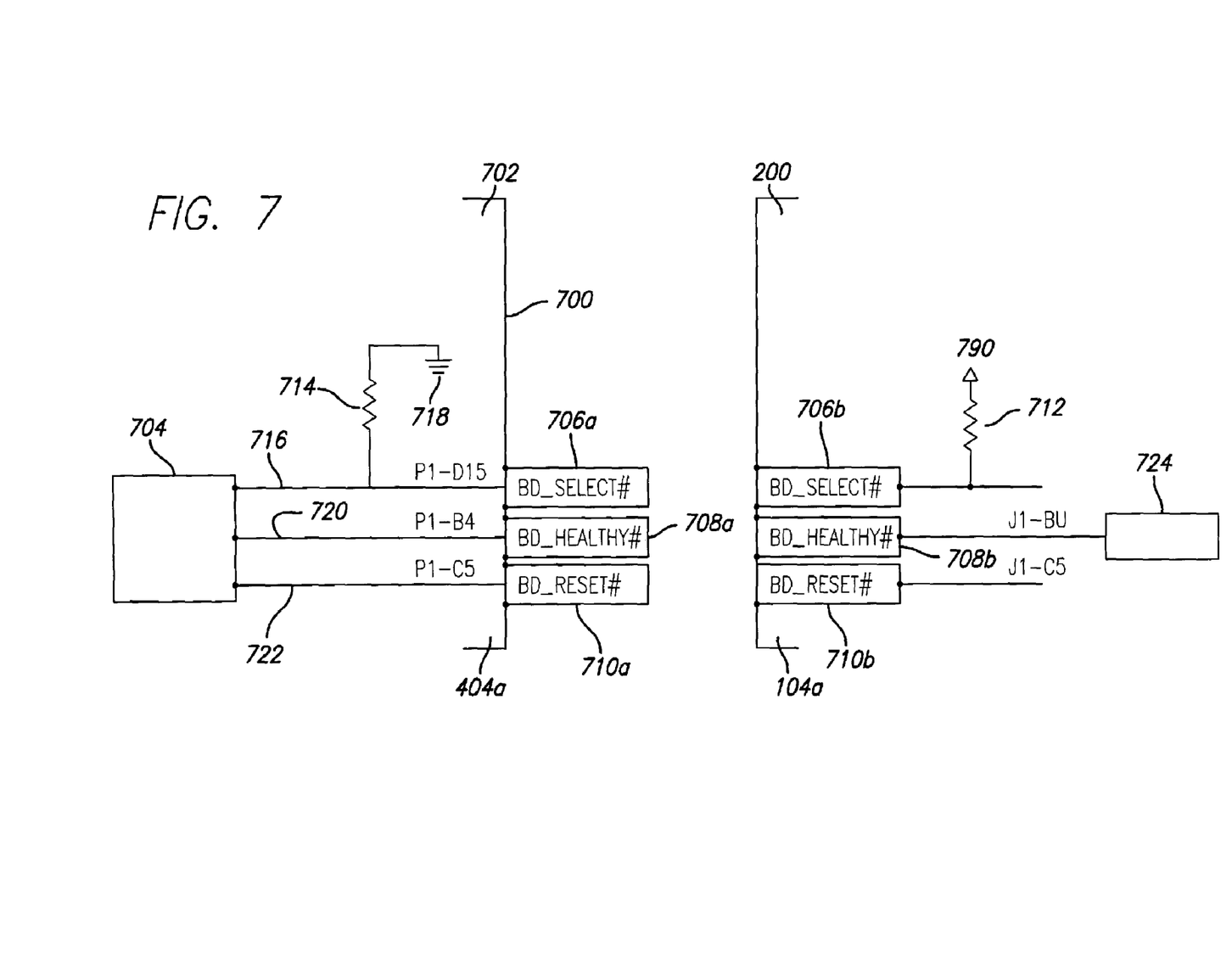
FIG. 7 shows a hot swappable CPCI system for detecting the presence of a hot swappable front card.

FIG. 7 shows a hot swappable CPCI system for detecting the presence of a hot swappable front card. Referring to FIG. 7, a CPCI backplane 700 has a connector 404a in a slot 702, and a hot swap controller 704 coupled to the backplane 700. The connector 404a has the BD_SELECT# 706a, BD_HEALTHY# 708a, and BD_RESET# 710a connector-pins, which are of male-type, connected to the hot swap controller 704. Note that the BD_SELECT# line 716 is connected to a "weak-pull-down" resistor 714 that is connected to a ground layer 718 in the backplane 702. A front card 200 has corresponding BD_SELECT# 706b, BD_HEALTHY# 708b, and BD_RESET# 710b connector-pins, which are of female-type, with the BD_SELECT# pin 706b being connected to a power domain (e.g., a voltage source) or more specifically an Early Power Domain 790 through a pull-up resistor 712. The BD_SELECT# line 716 is an input/output line and is defined to provide a signal to the hot swap controller 704 such that the controller 704 knows whether a hot swappable front card has been inserted in a particular slot. Further, the hot swap controller 704 performs the powering up/down of the hot swappable front card using this line 716. The BD_HEALTHY# pin 708b is connected to an internal power supply 724 in the front card 200. Accordingly, the BD_HEALTHY# line 720 is a hot swap controller input line and is used to indicate to the hot swap controller 704 whether or not the board is defective. The BD_RESET# line 722 is an input/output line and is used by the hot swap controller 704 to reset the front card if it is to remain in a backup mode. All of the above described functions of the BD_SELECT#, BD_HEALTHY#, and BD_RESET# lines are described in more detail below.

Specifically, when the hot swappable front card 200 is inserted into a slot of the backplane 702 such that the connectors 404a and 104a mate, the BD_SELECT# pin 706a is pulled up to the voltage level of the BD_SELECT# pin 706b. This pull-up on the BD_SELECT# pin 706a is detected by the hot swap controller 704 such that the hot swap controller 704 senses that a hot swappable front card 200 has been inserted in the particular slot 702. The hot swap controller 704 then drives the BD_SELECT# line 716 low so as to allow the front card to power up. Then, the hot swap controller 704 examines the BD_HEALTHY# line 720 to determine if the inserted front card 200 is healthy. This determination is made by sensing the voltage level from the internal power supply 724. The hot swap controller then drives the BD_RESET# line 722 high to release the front card from the reset mode and to connect to the system, or if the front card is a backup board, then the BD_RESET# line 722 is driven low to maintain the front card 200 in the reset mode until backup is needed from the front card 200.

Figure 8:
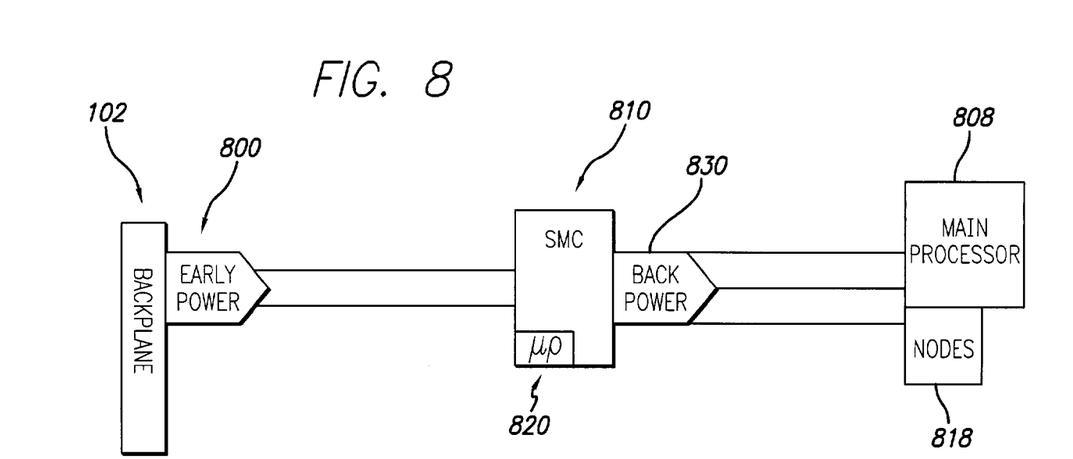
FIG. 8 is a block diagram that illustrates a distribution of an early power to a secondary processor and a back power domain to a main processor according to an embodiment of the invention.

Referring now to FIGS. 1 and 8, a front card 108 (e.g., motherboard) of the present invention is preferably a Hot Swap/HA front card having features and functions similar to those described above. In addition, the front card 108 of the present invention features two time-separated power domains, an early power 800 and a back power 830. A main processor (or CPU) 808 and a secondary processor 820 (e.g., a microprocessor) are also included on the front card 108. In one embodiment, the Hot Swap/HA front card 108 of the present invention is in compliance with PICMIG specifications. The front card 108 should also be capable of supporting the currently available main processor standards for the CPCI front card, such as the first generation UltraSPARC® IIe processor standards (the first generation main processor standards). In addition, the front card 108 should also be able to transition and support any evolving processor standards, such as the next generation of main processor standards, such as second/later generation UltraSPARC® IIe processor standards (the later generation main processor standards).

The challenge presented in supporting two or more main processor standards is that each of the main processors may have different power sequencing requirements or standards. For example, a first main processor, such as a first generation main processor, may require that Input/Output voltage (VIO) (e.g., a voltage used to power the input/output interfaces of the main processor) be present before core voltage (e.g., a voltage used to power the logics within the main processor). A second main processor, such as a later generation processor, may have an opposite requirement (i.e. core voltage must be present before VIO). To resolve the above described challenge, an embodiment of the invention uses hardware that was already featured in the design (for hotswap support) and provides a secondary microprocessor (e.g., the microprocessor 820 in the system management controller—SMC—810) with microprocessor firmware to control the sequencing of power to the main processor. In one embodiment, the microprocessor firmware is written onto a read-only memory (ROM) associate with the microprocessor 820. In another embodiment, the firmware is a combination of software and hardware.

Now referring back to FIGS. 1 and 8, a CPCI hotswap system of the present invention may comprise a chassis 100 having a backplane (or centerplane) 102 and a power supply 120 that supplies a plurality of powers having various voltages (e.g., +12V, −12V, 3.3V, 5V) to the backplane 102. A PICMIG compliant hotswappable front card (or motherboard) 108 may be inserted onto the backplane even when the power supply is switched on ("hot-insertion") In HA (Highly Available) hotswap systems, the inserted front card 108 may include a SMC 810. The SMC 810 includes a microprocessor (or a secondary processor or a µP) 820, a hotswap controller (not shown), and system monitoring ICs (not shown). A first power (i.e., an early power 800) to these devices (i.e., devices for SMC 810) is provided directly from the backplane 102. The front card's main processor 808 and other functional nodes 818 of the front card 108 are initially switched OFF and receive no power. The SMC 810 performs a number of checks (e.g., the SMC 810 checks if the power supply 120 on the backplane 102 is working properly) and, when checks are successfully completed, switches a second power (i.e., a backend power 830 having a VIO and a core voltage) on to the main processor 808 and the other functional nodes 818 of the front card 108, thus enabling the front card 108 to be fully operational.

Figure 9:
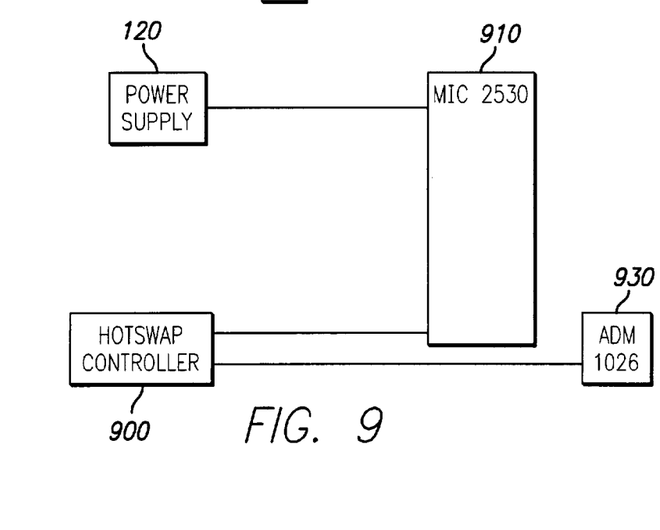
FIG. 9 is a block diagram that illustrates an interconnection between an analog device and a power sequencing integrated circuit chip via a hotswap controller according to an embodiment of the invention.

In a first embodiment of the present invention, referring now also to FIG. 9 when the hotswappable front card 108 is "hot-inserted" (inserted to the backplane or centerplane 102 while it is powered on), the hotswap controller 900 of the front card 108 allows for safe insertion and extraction of the front card 108. The hotswap controller 900 provides supervisory functions for the various voltages (e.g., 5V, 3.3V, +12V, −12V) supplied from the CPCI system's power supply (or supplies) 120 of the CPCI system. The hotswappable front card 108 may use a hotswap controller 910 comprising an integrated circuit (IC) chip (e.g., a Micrel MIC2580 chip 910) for this purpose. Specifically, the MIC2580 chip 910 generates a one volt (1V) precharge voltage, as required by PICMIG Hotswap Specification. The MIC2580 chip 910 asserts signal and/or multiple health check signal(s), such as the status signal "FAULT" and/or "POWER GOOD," to indicate the status of the power circuit. For example, if there is an overcurrent problem, a "FAULT" signal is asserted. The MIC2580 chip's status signals are fed to the system monitoring IC or ICs. A hardwired device or an analog device (e.g., an ADM1026 analog device 930) may be used as the system monitoring IC for the front card 108. Specifically, the analog device 930 (or the system monitoring IC) monitors various voltages and temperatures on the front card 108. It is the ADM1026 analog device 930 (or the system monitoring IC) that communicates via a bus, such as an I2C interface or bus, to the front card's service microprocessor 820 of the SMC 810. Since the ADM1026 analog device 930 comprises a digital-to-analog conversion (DAC) output and a pulse-width-modulated (PWM) output, the front card's service microprocessor 820 (through its sequencing firmware) uses the ADM1026 DAC/PWM outputs to control sequencing of power. In one embodiment, the ADM1026 controls the PWM output by using a resistor capacitor (RC) on the PWM output.

In a second embodiment of the present invention, the analog device (e.g., the ADM1026 analog device 930) comprises an analog-to-digital converter (ADC) output for providing ADC signals that are used with the front card's service microprocessor to monitor and control the power sequencing of the various voltages. In one embodiment, analog voltages on the front card are connected to the ADC input of the analog device. The analog device converts the analog voltages into a plurality of digital signals. The analog device can then generate an alert to the service microprocessor if the front card voltages exceed a pre-specified range. The ADC input and the other supporting circuitries used by the microprocessor to monitor and control the power sequencing may be already present on the front card (e.g., being and/or designed to be used for other functions and/or purposes). The ADC may be associated with (or located within) an analog device (e.g., an ADM1026 analog device 930) of the front card.

In a third embodiment of the present invention, many and/or all of the hardwired mechanisms used on the front card for power sequencing are eliminated because the SMC 810 though the analog device may now be used to provide many and/or all of the functions provided by these eliminated hardwired mechanisms. In one embodiment, the specific hardwired mechanisms used for power sequencing and the glue mechanisms (or connecting mechanisms) for these specific hardwired mechanisms are eliminated on the front card.

In a first, more specific front card embodiment of the present invention, a core voltage is supplied to the front card from a power supply (e.g., a 5V power supply) using a direct-current to direct-current (DC/DC) converter, such as a DC/DC converter that converts a voltage (e.g., 5V) from the power supply to a core voltage (e.g., 1.8V), such as a Vddcore DC/DC converter. A DAC output and a PWM output (of an analog device on the front card) are fed to operational amplifier ("opamp") comparator circuits (for outputting amplified voltage(s) after comparing two or more input voltages). The opamp comparator circuits control (e.g., turns on and off) a plurality of Metal-Oxide-Semiconductor (MOS) Field Effect Transistors (FETs) (or MOSFETs) that provide a 3.3V (e.g., a VIO) and a 5V. Specifically, the DAC output is used to switch on the 3.3V back power to the main processor and the PWM output is used to switch on the 5V back power. The 5V is then used to supply the core voltage to the main processor. Thus, referring now to FIGS. 1 and 10, when a first generation main processor is used as the main processor 808 of the front card 108, the secondary microprocessor 810 (or the service microprocessor of the SMC) through an interface 1000 (e.g., a I2C) to an analog device (e.g., an ADM1026 analog device 930) provides instructions so that the 3.3V back power (having the VIO) is first provided to the main processor, followed by the core voltage. Conversely, when a later generation main processor is used as the main processor 808 on the front card 108, the Vddcore DC/DC converter (not shown) is switched on (so that the core power is first provided to the main processor), followed by the MOSFET (not shown) that provide the 3.3V back power.

Figure 10:
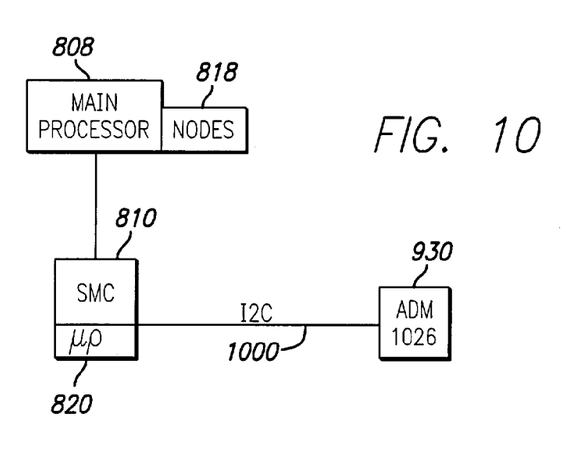
FIG. 10 is a block diagram that illustrates an interconnection between the analog device of FIG. 9 with a secondary processor according to an embodiment of the invention.

In a second, more specific front card embodiment of the present invention, a first MOSFET is used to provide the 3.3V to the main processor and a second MOSFET is used to provide the 5V. The first MOSFET is controlled (e.g., switch on) by using a DAC output of an analog device on the front card and the second MOSFET is also controlled by using the analog device. In one embodiment, the second MOSFET is controlled by the analog device using an RC on a PWM output of the analog device. Thus, in this embodiment of the present invention, the secondary microprocessor 810 (through a firmware running on the secondary microprocessor) uses the DAC output to provide the 3.3V and the PWM output to provide the 5V. The 5V then may be supplied to a Vddcore DC/DC converter on the front card 108 to provide a core voltage (e.g., 1.8V) to the main processor 808 of the front card 108. In addition, the 3V may be provided directly to the main processor 808 as the VIO for the main processor 808.

In another embodiment of the present invention, the SMC, through its microprocessor controls the exact sequencing of voltages to the main processor and/or a time interval (and/or time intervals) between the switching of the 3.3V/5V back power and core voltage. In addition, a slew rate of the power supply (i.e., a power output rate of the power supply or a power transfer rate to the main processor) may be controlled by programming the DAC (and/or the PWM) output(s) of the analog device(s) as specified by the firmware (i.e., the microprocessor firmware) of the SMC.

In general, according to the foregoing, an embodiment of the present invention provides a service processor (e.g., a microprocessor) and a firmware driven on the service processor to provide complex and variable voltage sequencing of the back voltage power to a main processor. Specifically, in one embodiment, the firmware is using electrical circuitry (such as one or more analog-to-digital converters—ADCs) to monitor the various voltages. In another embodiment (especially in an ADC implementation that does not require speed acquisition), one ADC with a front end multiplexer is used to provide multi-ADCs like features. The ADC(s) and other circuitry are typically free/built (and/or already built) with the service processor (typically an embedded microcontroller) and general-purpose companion device, such as the ADM1026. Thus, the present invention provides a low-cost and highly flexible system that can control and change power sequences during the system's (e.g., a motherboard's) lifetime that overcomes the limitations of the prior art.

Figure 11:
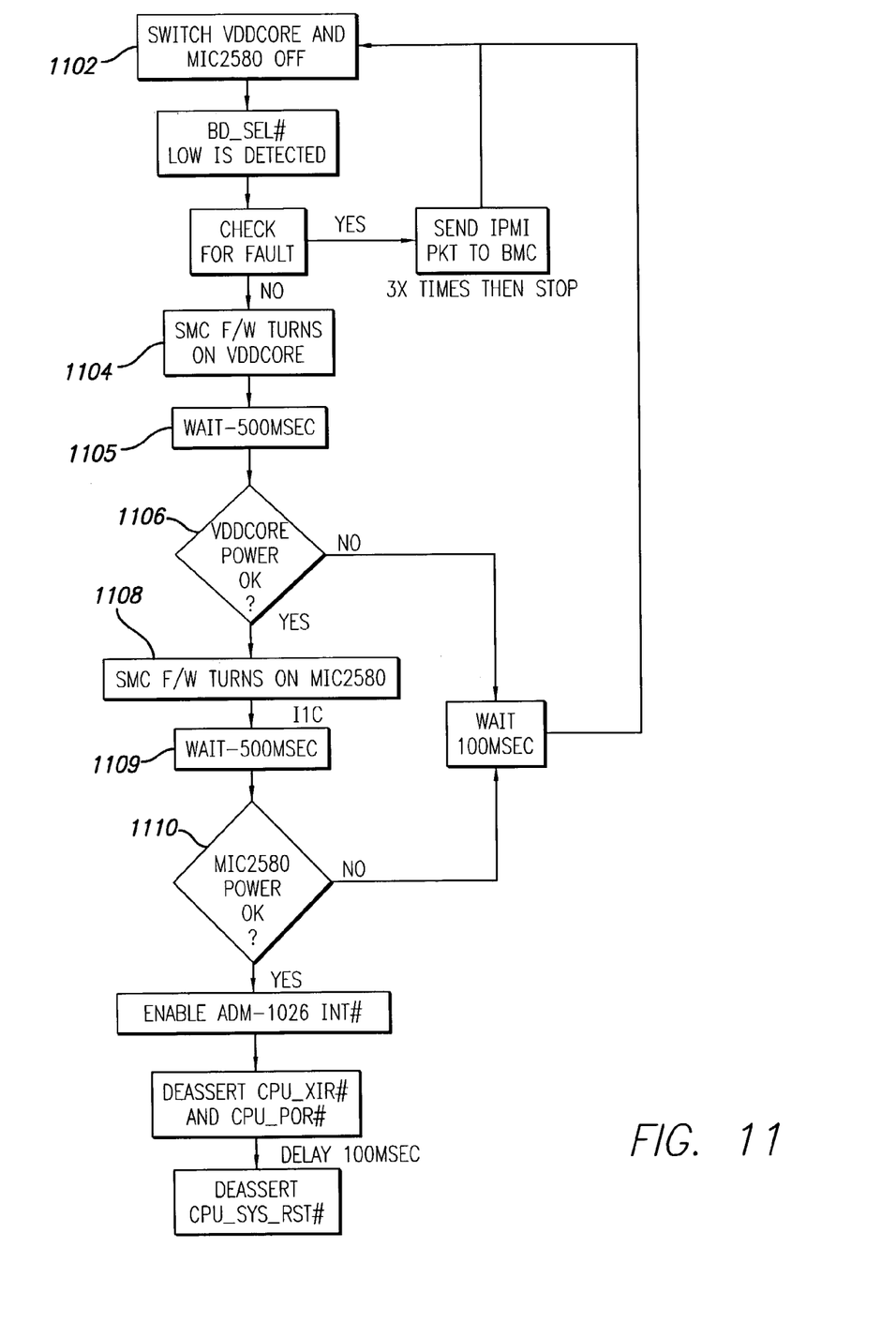
FIG. 11 is a flow diagram showing exemplary steps of a method according to the invention.

In addition, the present invention provides a method, such as exemplary method 1100 for providing power control and power sequencing on a front card (e.g., a motherboard), as diagrammed in FIG. 11. At step 1102, a Vddcore DC/DC converter and a MIC2580 on the front card are operatively switched off. At step 1104, a SMC on the front card switches on the Vddcore DC/DC converter. At steps 1105 and 1106, following a first predetermined time interval (e.g., 500 msec), the SMC checks if the core power has been properly provided to a main processor on the front card. If the core power has not been properly provided and after waiting a second predetermined time interval (e.g., 100 msec), step 1102 is repeated. If the core power is properly provided, the SMC turns on the MIC2580 and provides the VIO to the main processor at step 1108. Following a third predetermined time interval (e.g., 500 msec) at step 1109, the SMC checks if the MIC2580 is functioning properly at step 1110. If the MIC2580 is determined to be not functioning properly and after waiting the second predetermined time interval, step 1102 is repeated. In addition, the method 1100 diagramed in FIG. 11 may include a mechanism that detects the type of main processor that is on the front card before the SMC provides the power control and power sequencing functions. Moreover, depending on the type of main processor on the front card, the SMC may be used to provide the VIO before the core voltage. Thus, the method diagrammed in FIG. 11 is provided as an example by which the invention is not limited.

Having thus described embodiments of the present invention, it should be apparent to those skilled in the art that certain advantages of the described system have been achieved. It should also be appreciated that various modifications, adaptations, and alternative embodiments thereof may be made within the scope and spirit of the present invention. For example, a CPCI system and a CPCI front card has been illustrated, but it should be apparent that the inventive concepts described above would be equally applicable to other types of buses, motherboards, and computer systems. The invention is further defined by the following claims.

What is claimed is:

1. A Compact Peripheral Component Interconnect (CPCI) system comprising:
    a circuit board;
    a power supply coupled to said circuit board;
    a front card coupled to said power supply via said circuit board, said front card including a main processor, and said power supply providing a plurality of powers having a plurality of voltages to said main processor on said front card;
    a hardware unit located on said front card, said hardware unit comprising a digital-to-analog converter (DAC) output, a pulse-width-modulated (PWM) output, and an analog-to-digital (ADC) input;
    a microprocessor located on said front card coupled to said hardware unit, said microprocessor controlling and monitoring said hardware unit; and
    microprocessor firmware, wherein said microprocessor is configured to execute said microprocessor firmware, wherein responsive to executing said firmware, said microprocessor is configured to operate said hardware unit to control and monitor a power sequencing operation of said main processor.

2. The CPCI system of claim 1, wherein said power sequencing operation comprises providing a first voltage before a second voltage.

3. The CPCI system of claim 2, wherein said microprocessor firmware also dynamically controls a time interval between providing said first voltage and said second voltage.

4. The CPCI system of claim 2, wherein said first voltage comprises a core voltage for said main processor and wherein said second voltage comprises an input/output voltage for said main processor.

5. The CPCI system of claim 2, wherein said first voltage comprises an input/output voltage for said main processor and wherein said second voltage comprise a core voltage for said main processor.

6. The CPCI system of claim 1, wherein said power sequencing operation provides a core voltage for said main processor and an input/output voltage for said main processor at a predetermined sequence.

7. The CPCI system of claim 6, further comprising a direct-current to direct-current (DC/DC) converter and wherein said core voltage for said main processor is supplied using said DC/DC converter.

8. The CPCI system of claim 7, further comprising first and second Metal-Oxide-Semiconductor Field Effect Transistors (MOSFETs) and wherein said input/output voltage is provided from said first MOSFET.

9. The CPCI system of claim 8, wherein said microprocessor firmware turns on said DC/DC converter before said first MOSFET.

10. The CPCI system of claim 8, wherein said microprocessor firmware turns on said first MOSFET before said DC/DC converter.

11. The CPCI system of claim 8, wherein said second MOSFET provides a second voltage, wherein said second voltage is provided to said DC/DC converter, wherein said DC/DC converter uses said second voltage to provide said core voltage for said main processor.

12. The CPCI system of claim 11, wherein said hardware unit is a system monitoring integrated circuit (IC) for said front card, wherein said microprocessor firmware is stored within an read-only memory (ROM) associated with said microprocessor, and wherein said microprocessor firmware is for running only on said microprocessor.

13. The CPCI system of claim 12, wherein said first MOSFET is controlled using said DAC output and said second MOSFET is controlled using said hardware unit.

14. The CPCI system of claim 13, wherein said hardware unit controls said second MOSFET using said PWM output.

15. The CPCI system of claim 14, wherein said PWM output comprises a resistor capacitor (RC) circuit and wherein said hardware unit controls said second MOSFET using said RC circuit.

16. The CPCI system of claim 1, wherein said ADC output is coupled to receive an analog voltage signal on said front card and wherein said hardware unit converts said analog voltage signal to a digital voltage signal.

17. The CPCI system of claim 16, wherein said hardware unit is configured to use said digital voltage signal to alert said microprocessor if said digital voltage signal indicates a front card voltage indicated by said analog voltage signal exceeds a pre-specified range.

18. The CPCI system of claim 1, wherein said DAC output is used to provide a first voltage to said main processor and said PWM output is used to provide a second voltage to said main processor.

19. The CPCI system of claim 1, wherein a hardwired mechanism for power sequencing is eliminated on said front card.

20. The CPCI system of claim 1, wherein said microprocessor firmware also dynamically controls a slew rate of said power supply.

21. A method for implementing a power sequencing on a Compact Peripheral Component Interconnect (CPCI) front card, comprising the steps of:
    coupling a power supply to a main processor on said front card through a circuit board;
    providing said front card with a hardware unit including a digital-to-analog converter (DAC) output, a pulse-width-modulated (PWM) output, and an analog-to-digital converter (ADC) input;
    providing a microprocessor firmware to be executed on a microprocessor located on said front card;
    using said microprocessor firmware executing on said microprocessor to control said DAC output and said PWM output;
    using said microprocessor firmware running on said microprocessor to monitor a digital voltage signal derived from said ADC input;
    determining by said microprocessor firmware a sequence to provide a first voltage and a second voltage from said power supply to said main processor;
    using said microprocessor firmware executing on said microprocessor to provide said sequence of said first voltage and said second voltage to said main processor through said DAC output and said PWM output.

22. The method of claim 21, wherein said first voltage for said main processor is provided from said power supply through a direct-current to direct-current (DC/DC) converter and said second voltage for said main processor is provided from said power supply through at least one of a plurality of Metal-Oxide-Semiconductor Field Effect Transistors (MOSFETs).

23. The method of claim 21, wherein said using said microprocessor firmware running on said microprocessor to provide said determined sequence comprises:
   using said PWM output to provide a third voltage;
   using said third voltage to provide said first voltage through a direct-current to direct-current (DC/DC) converter; and
   using said DAC output to provide said second voltage through a Metal-Oxide-Semiconductor Field Effect Transistor (MOSFET).

24. The method of claim 21, wherein said first voltage for said main processor is provided through a first Metal-Oxide-Semiconductor Field Effect Transistor (MOSFET) and said second voltage for said main processor is provided through a second MOSFET and wherein said using said microprocessor firmware to control said determined sequence comprises:
   controlling said first MOSFET by using said DAC output; and
   controlling said second MOSFET by using a resistor capacitor (RC) circuit on said PWM output.

25. The method of claim 21, further comprises using said microprocessor firmware to control a time interval between providing said first voltage for said main processor and said second voltage for said main processor.

26. The method of claim 21, further comprises using said microprocessor firmware to control a power transfer rate to said main processor.

27. The method of claim 21, wherein said main processor comprises one of a first main processor and a second main processor, wherein said first main processor has a first power sequencing requirement and said second main processor has a second power sequencing requirement, wherein said first power sequencing requirement differs from said second power sequencing requirement, and wherein said microprocessor firmware can be used with both said first main processor and said second main processor.

* * * * *